United States Patent
Iguchi et al.

(10) Patent No.: US 10,454,665 B2
(45) Date of Patent: Oct. 22, 2019

(54) HYBRID-CONTROLLED CLOCK GENERATION

(71) Applicant: Qualcomm Incorporated, San Diego, CA (US)

(72) Inventors: Shunta Iguchi, San Diego, CA (US); Ilker Deligoz, Chandler, AZ (US); Michael Naone Farias, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/924,066

(22) Filed: Mar. 16, 2018

(65) Prior Publication Data
US 2019/0288829 A1   Sep. 19, 2019

(51) Int. Cl.
| | | |
|---|---|---|
| H04L 7/00 | (2006.01) | |
| H03B 5/36 | (2006.01) | |
| H04B 1/40 | (2015.01) | |
| H03G 3/00 | (2006.01) | |
| H03K 17/687 | (2006.01) | |

(52) U.S. Cl.
CPC ............ *H04L 7/0008* (2013.01); *H03B 5/36* (2013.01); *H03G 3/00* (2013.01); *H03G 3/002* (2013.01); *H03K 17/687* (2013.01); *H04B 1/40* (2013.01)

(58) Field of Classification Search
CPC .......... H04L 7/0008; H03B 5/36; H03G 3/00; H03G 3/002; H03K 17/687; H04B 1/40
See application file for complete search history.

(56) References Cited

U.S. PATENT DOCUMENTS

| | | | |
|---|---|---|---|
| 5,706,004 A | 1/1998 | Yeung | |
| 6,028,460 A * | 2/2000 | McCollum | H03L 7/095 327/105 |
| 7,395,289 B2 * | 7/2008 | Shiung | G06F 1/0321 708/272 |
| 7,808,292 B2 | 10/2010 | Carragher et al. | |
| 8,299,951 B1 | 10/2012 | Kutz et al. | |
| 8,947,148 B2 | 2/2015 | Atout | |
| 2001/0033193 A1 * | 10/2001 | Chien | G06G 7/14 327/355 |

(Continued)

FOREIGN PATENT DOCUMENTS

| | | | | |
|---|---|---|---|---|
| CN | 102347767 A | | 2/2012 | |
| EP | 1434353 A1 * | | 6/2004 | H03L 7/193 |

*Primary Examiner* — Sophia Vlahos
(74) *Attorney, Agent, or Firm* — Colby Nipper/Qualcomm (57) ABSTRACT

An apparatus is disclosed for hybrid-controlled clock generation. In an example aspect, the apparatus includes an analog control circuit, a digital control circuit, a transistor array, an oscillator circuit, and a selection circuit. The oscillator circuit is coupled to the transistor array. The selection circuit includes a first input that is coupled to the analog control circuit, a second input that is coupled to the digital control circuit, and an output that is coupled to the transistor array. The selection circuit is configured to obtain a selection signal that is indicative of the first input coupled to the analog control circuit or the second input coupled to the digital control circuit. The selection circuit is also configured to connect, based on the selection signal, the analog control circuit or the digital control circuit to the transistor array.

30 Claims, 7 Drawing Sheets

(56) References Cited

U.S. PATENT DOCUMENTS

| | | | |
|---|---|---|---|
| 2003/0017817 A1* | 1/2003 | Cowley | H03J 3/08 |
| | | | 455/323 |
| 2003/0194046 A1* | 10/2003 | Shirar | G01R 23/15 |
| | | | 377/19 |
| 2009/0251226 A1* | 10/2009 | Kathuria | H03L 7/095 |
| | | | 331/1 R |
| 2009/0322386 A1* | 12/2009 | Wu | H03K 23/667 |
| | | | 327/117 |
| 2013/0187691 A1* | 7/2013 | Sreekiran | H03H 11/04 |
| | | | 327/157 |
| 2016/0099765 A1* | 4/2016 | Hosokawa | H04B 1/16 |
| | | | 375/347 |
| 2017/0324442 A1* | 11/2017 | Casagrande | H04B 1/7073 |

* cited by examiner

HYBRID-CONTROLLED CLOCK GENERATION

TECHNICAL FIELD

This disclosure relates generally to clock generation and, more specifically, to utilizing an analog control circuit or a digital control circuit to respectively provide closed-loop control or open-loop control of a clock signal.

BACKGROUND

Electronic devices use radio-frequency (RF) signals to communicate information. These radio-frequency signals enable users to talk with friends, download information, share pictures, remotely control household devices, receive global positioning information, employ radar for detection and tracking, or listen to radio stations. To generate these radio-frequency signals, an electronic device may include a clock generator, which generates a clock signal. The clock signal provides a stable frequency reference, which can be used to perform wireless communication. The clock signal may be provided, for example, to a mixer for frequency conversion (e.g., up-converting or down-converting communication signals) or a phase-locked loop for generating another signal having a different stable frequency reference.

Due to a reliance upon the clock signal, any frequency errors or noise in the clock signal can directly impact communication quality and performance. In some cases, operations performed using the clock signal may further increase a magnitude of the frequency errors or noise of the clock signal. As such, it is important that noise in the clock signal be within some predetermined threshold. One particular type of noise is phase noise, which represents random fluctuations in a phase of the clock signal. High levels of phase noise can raise an overall noise floor of a receiver, which decreases a sensitivity or a dynamic range of an electronic device. This makes it more challenging for the electronic device to detect weaker signals or signals that originate at farther distances.

Phase-noise performance of a clock generator can depend upon many factors, including power consumption and types of components. Better phase-noise performance is typically realized with higher power consumption or through utilizing larger size components. The former is expensive in terms of battery usage, and the latter is expensive in terms of device cost. Furthermore, different communication standards may be associated with different phase-noise thresholds. If an electronic device supports multiple communication standards (e.g., cellular, global positioning system (GPS), Wi-Fi, or Bluetooth™), a design of the clock generator may have to support more than one phase-noise threshold. Overall, it becomes challenging to design a clock generator that supports multiple communication standards, conserves power, and physically fits within a designated space.

SUMMARY

An apparatus is disclosed that implements hybrid-controlled clock generation. A hybrid analog and digital architecture enables a clock generator to support multiple communication standards, conserve power, and physically fit within a designated space. An analog control circuit or a digital control circuit is used to respectively provide closed-loop control or open-loop control of a clock signal. A size of the analog control circuit can be made smaller such that the analog control circuit is noisier than the digital control circuit. Hence, the analog control circuit is used for situations in which a phase-noise threshold is high (e.g., for a high-noise state). In contrast, the digital control circuit is used for situations in which the phase-noise threshold is low (e.g., for a low-noise state). Via an open-loop control mechanism, the digital control circuit can control the generation of the clock signal based on a communication standard, environmental data, process parameters, and so forth. For example, the digital control circuit can achieve different phase-noise thresholds that are associated with different communication standards. Both the analog control circuit and the digital control circuit can also control the clock signal to realize different target power consumption levels. Using the techniques of hybrid-controlled clock generation as described herein, the analog control circuit and the digital control circuit can jointly occupy a small footprint to save space within an electronic device without compromising phase-noise performance or power consumption. Furthermore, described techniques can be used to support single-oscillator designs, which reduce the cost of the electronic device relative to multiple-oscillator designs.

In an example aspect, an apparatus is disclosed. The apparatus includes an analog control circuit, a digital control circuit, a transistor array, an oscillator circuit, and a selection circuit. The oscillator circuit is coupled to the transistor array. The selection circuit includes a first input that is coupled to the analog control circuit, a second input that is coupled to the digital control circuit, and an output that is coupled to the transistor array. The selection circuit is configured to obtain a selection signal that is indicative of the first input coupled to the analog control circuit or the second input coupled to the digital control circuit. The selection circuit is also configured to connect, based on the selection signal, the analog control circuit or the digital control circuit to the transistor array.

In an example aspect, an apparatus is disclosed. The apparatus includes an analog control circuit, a digital control circuit, and a transistor array. The transistor array is configured to generate a bias current based on a control voltage. The apparatus also includes selection means for providing the control voltage to bias the transistor array. The selection means is coupled to the analog control circuit, the digital control circuit, and the transistor array. The selection means is configured to connect the analog control circuit or the digital control circuit to the transistor array based on a selection signal. The apparatus further includes an oscillator circuit that is coupled to the transistor array. The oscillator circuit is configured to generate a clock signal based on the bias current.

In an example aspect, a method for hybrid-controlled clock generation is disclosed. The method includes generating an analog control signal and generating a digital control signal. The method also includes selecting the analog control signal or the digital control signal. Responsive to the selecting of the analog control signal or the digital control signal, the method includes biasing a transistor via the analog control signal or the digital control signal, respectively, to produce a biased transistor. In addition, the method includes generating a bias current via the biased transistor. The method also includes generating a clock signal based on the bias current.

In an example aspect, an apparatus is disclosed. The apparatus includes a transistor array, an oscillator circuit, an automatic gain control circuit, a processor, a register, and a multiplexer. The oscillator circuit is coupled to the transistor array. The automatic gain control circuit is coupled to the oscillator circuit. The register is coupled to the processor.

The multiplexer includes a first input that is coupled to the automatic gain control circuit, a second input that is coupled to the register, an output that is coupled to the transistor array, and a selection input that is coupled to the processor.

DETAILED DESCRIPTION

Electronic devices use clock generators to support radio-frequency communications. A clock generator typically includes an oscillator circuit that generates a clock signal with a predetermined frequency. This clock signal can be referenced by other components in the electronic device, including mixers, signal generators, phase-locked loops (PLLs), delay-locked loops (DLLs), and so forth. Due to a reliance upon the clock signal, any frequency errors or phase noise in the clock signal can propagate to downstream circuit components, thereby impacting communication quality and performance.

A clock generator may include an automatic gain control (AGC) circuit, which controls an amplitude of the clock signal and enables an oscillator circuit thereof to initiate and maintain stable oscillation. However, the automatic gain control circuit can be noisy, which contributes to the noise in the clock signal. Some automatic gain control circuits may utilize larger active components, such as transistors having larger lengths and widths. These larger components may produce less noise (e.g., less flicker noise or shot noise) at an expense of increasing an overall size of the automatic gain control circuit. As an example, a phase noise improvement between approximately ten to twenty decibels may be realized by increasing an area of the automatic gain control circuit by a factor of ten. However, this additional area may not be available, especially in smaller, portable electronic devices. In certain situations, the available space may make it unrealistic to achieve the lower phase-noise thresholds that are associated with some communication standards, such as a $5^{th}$ Generation (5G) cellular standard.

Different communication standards may also be associated with different phase-noise thresholds. If the electronic device supports multiple communication standards (e.g., cellular, global positioning system (GPS), Wi-Fi, or Bluetooth™), a design of the clock generator may also have to support more than one phase-noise threshold. Furthermore, the phase-noise threshold can change over time based on which communication standard is being used. In such situations, increasing the physical size of the automatic gain control circuit may result in unrealized benefits when the clock generator exceeds target phase-noise performance (e.g., the exhibited phase noise is significantly lower than the phase-noise threshold).

To handle situations involving multiple communication standards, some techniques utilize multiple oscillator circuits. Performance of the multiple oscillator circuits are respectively tuned for corresponding ones of the multiple communication standards. However, implementing the multiple oscillator circuits adds additional complexity to the electronic device and increases costs. Furthermore, the multiple oscillator circuits occupy additional space in the electronic device and involve additional wire routing.

In contrast, example approaches are described herein for hybrid-controlled clock generation. A hybrid analog and digital architecture enables a clock generator to support multiple communication standards, conserve power, and physically fit within a designated space. An analog control circuit or a digital control circuit is used to respectively provide closed-loop control or open-loop control of a clock signal. A size of the analog control circuit can be made small such that the analog control circuit is noisier than the digital control circuit. Thus, the analog control circuit is used for situations in which a phase-noise threshold is relatively high (e.g., for a high-noise state). The digital control circuit, on the other hand, is used for situations in which the phase-noise threshold is relatively low (e.g., for a low-noise state). The digital control circuit can control the generation of the clock signal based on a communication standard, environmental data, process parameters, and so forth. For example, the digital control circuit can achieve different phase-noise thresholds that are associated with different communication standards. Both the analog control circuit and the digital control circuit can also control the clock signal to realize different target power consumption levels as described herein.

Using the techniques of hybrid-controlled clock generation, the analog control circuit and the digital control circuit can jointly occupy a small footprint. Assuming a 150 nanometer (nm) complementary metal-oxide-semiconductor (CMOS) process, a total area of the analog control circuit and the digital control circuit may be, for example, less than 10,000 micrometers squared ($\mu m^2$), less than 6,000 $\mu m^2$, and so forth. As a result, implementations of the hybrid-controlled clock generation techniques can save space within an electronic device without compromising phase-noise performance or power consumption. Furthermore, described techniques can be used to support single-oscillator designs, which reduce the cost of the electronic device relative to multiple-oscillator designs.

Figure 1:
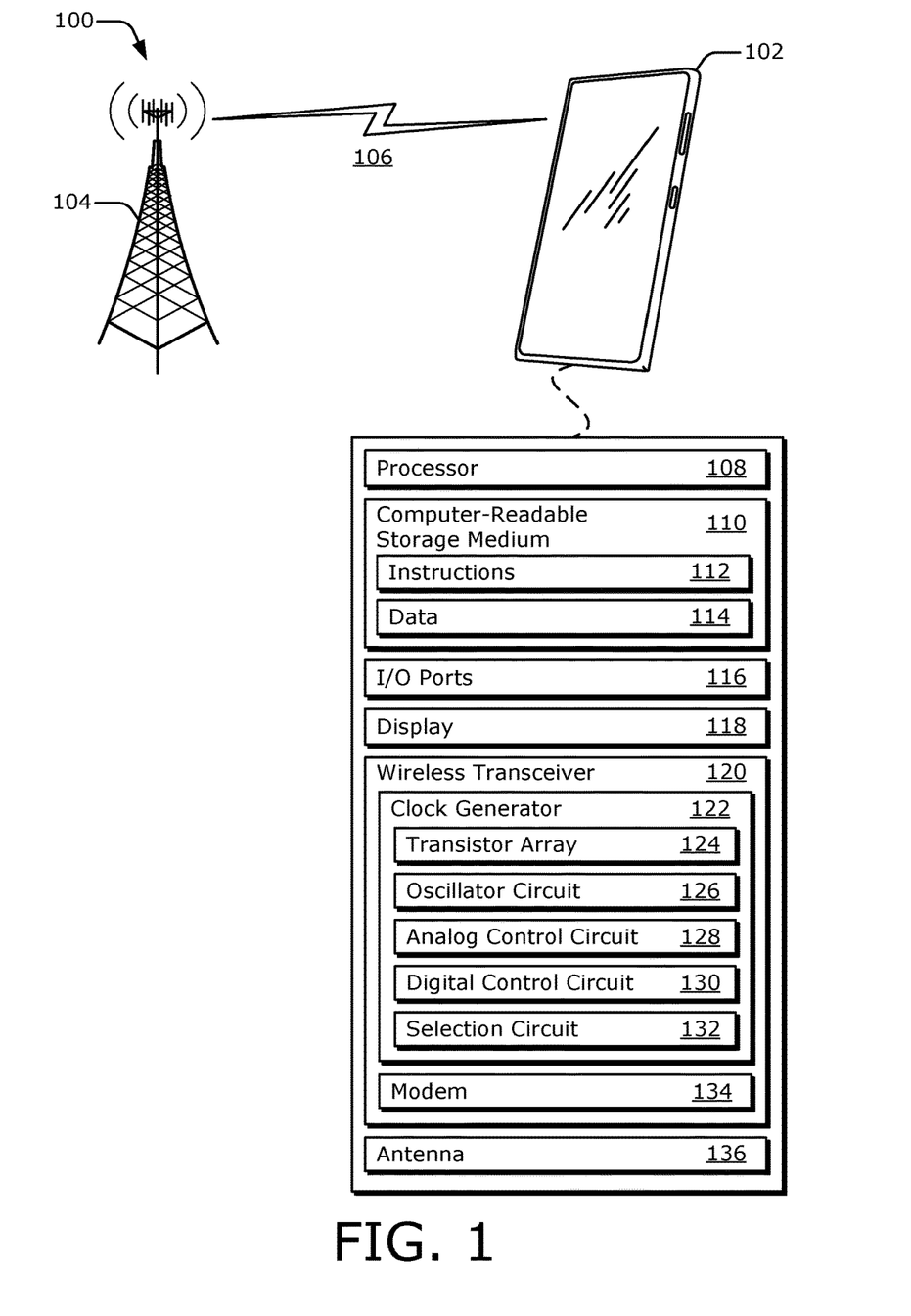
FIG. 1 illustrates an example environment for hybrid-controlled clock generation.

FIG. 1 illustrates an example environment 100 for hybrid-controlled clock generation. In the example environment 100, a computing device 102 communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, radar, radio, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102 and an uplink of other data or control information communicated from the computing device 102 to the base station 104. The wireless link 106 may be implemented using any suitable communication protocol or standard, such as a cellular mode (e.g., $3^{rd}$ Generation (3G), $4^{th}$ Generation (4G), or $5^{th}$ Generation (5G)), a Wi-Fi mode (e.g., IEEE 802.11), a WiMAX™ mode (e.g., IEEE 802.16), a Bluetooth™ mode, a near-field communication (NFC) mode, a global positioning system (GPS) mode, and so forth.

The computing device 102 includes a processor 108 and a computer-readable storage medium 110 (CRM 110). The processor 108 may include any type of processor, such as an application processor or multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. Alternately or additionally, the computing device 102 may include a wired transceiver, such as an Ethernet or fiber optic interface for communicating over a local network, intranet, or the Internet.

The wireless transceiver 120 includes circuitry and logic for transmitting and receiving communication signals via an antenna 136.

Components of the wireless transceiver 120 can include mixers, phase-locked loops, delay-locked loops, amplifiers, switches, radio-frequency (RF) filters, and so forth for conditioning the communication signals. The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receiver chains). In general, the wireless transceiver 120 processes data and/or signals associated with communicating data of the computing device 102 over the antenna 136.

As shown, the wireless transceiver 120 also includes at least one clock generator 122 and at least one modem 134. The clock generator 122 and the modem 134 can be implemented on separate integrated circuits. The clock generator 122 includes at least one transistor array 124, at least one oscillator circuit 126, at least one analog control circuit 128, at least one digital control circuit 130, and at least one selection circuit 132, which are further described with respect to FIG. 2. The analog control circuit 128, the digital control circuit 130, and the selection circuit 132 can at least partially implement hybrid-controlled clock generation, as described with reference to FIGS. 2-5.

The modem 134, or more generally a processor, processes data and/or signals associated with communication data of the computing device 102 over the antenna 136. The modem 134 may be implemented as a system-on-chip (SoC) that provides a digital communication interface for data, voice, messaging, and other applications of the computing device 102. The modem 134 may also include baseband circuitry to perform high-rate sampling processes that can include analog-to-digital conversion, digital-to-analog conversion, gain correction, skew correction, frequency translation, and so forth. The modem 134 can also control the selection of the analog control circuit 128 or the digital control circuit 130 and make adjustments to the digital open-loop control, as further described with respect to FIG. 6.

Figure 2:
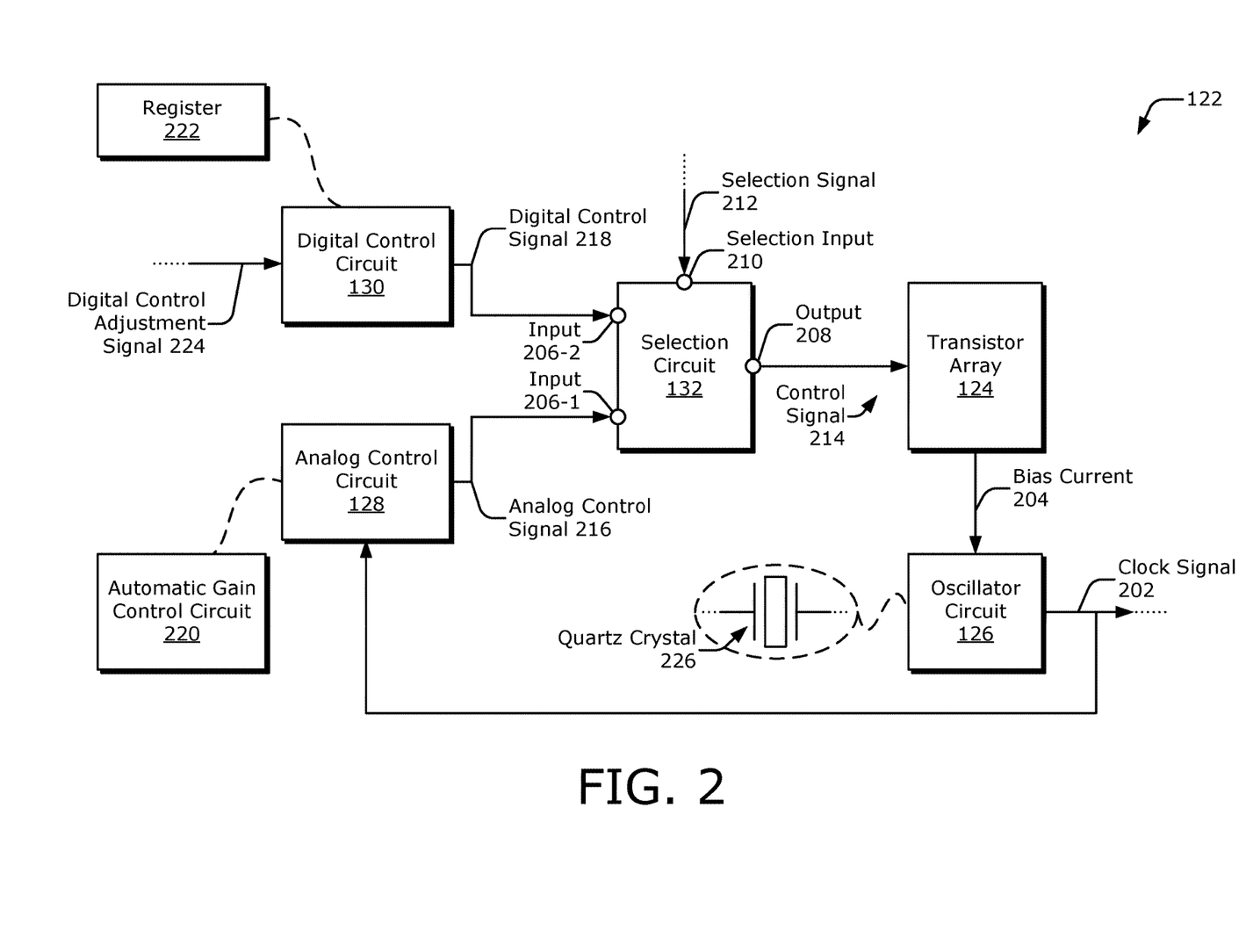
FIG. 2 illustrates an example implementation of a clock generator for hybrid-controlled clock generation.

FIG. 2 illustrates an example implementation of the clock generator 122 for hybrid-controlled clock generation. The clock generator 122 includes the transistor array 124, the oscillator circuit 126, the analog control circuit 128, the digital control circuit 130, and the selection circuit 132. The oscillator circuit 126 includes at least one oscillator (e.g., as few as one oscillator), which generates a clock signal 202. The oscillator can include, for example, a quartz crystal, as shown by quartz crystal 226. The techniques for hybrid-controlled clock generation can also be applied to other oscillator circuits 126, such as those including an inductor-capacitor (LC) oscillator, an oscillator transistor (e.g., a bipolar junction transistor (BJT), a junction gate field-effect transistor (JFET), a metal-oxide semiconductor field-effective transistor (MOSFET), or a gallium arsenide field-effect transistor (GaAsFET)), a transmission line, a diode, a piezo-electric oscillator, multiple quartz crystals 226, multiple oscillators, and so forth. Other components can also be included in the oscillator circuit 126, such as resistors, capacitors, and other transistors.

Figure 4:
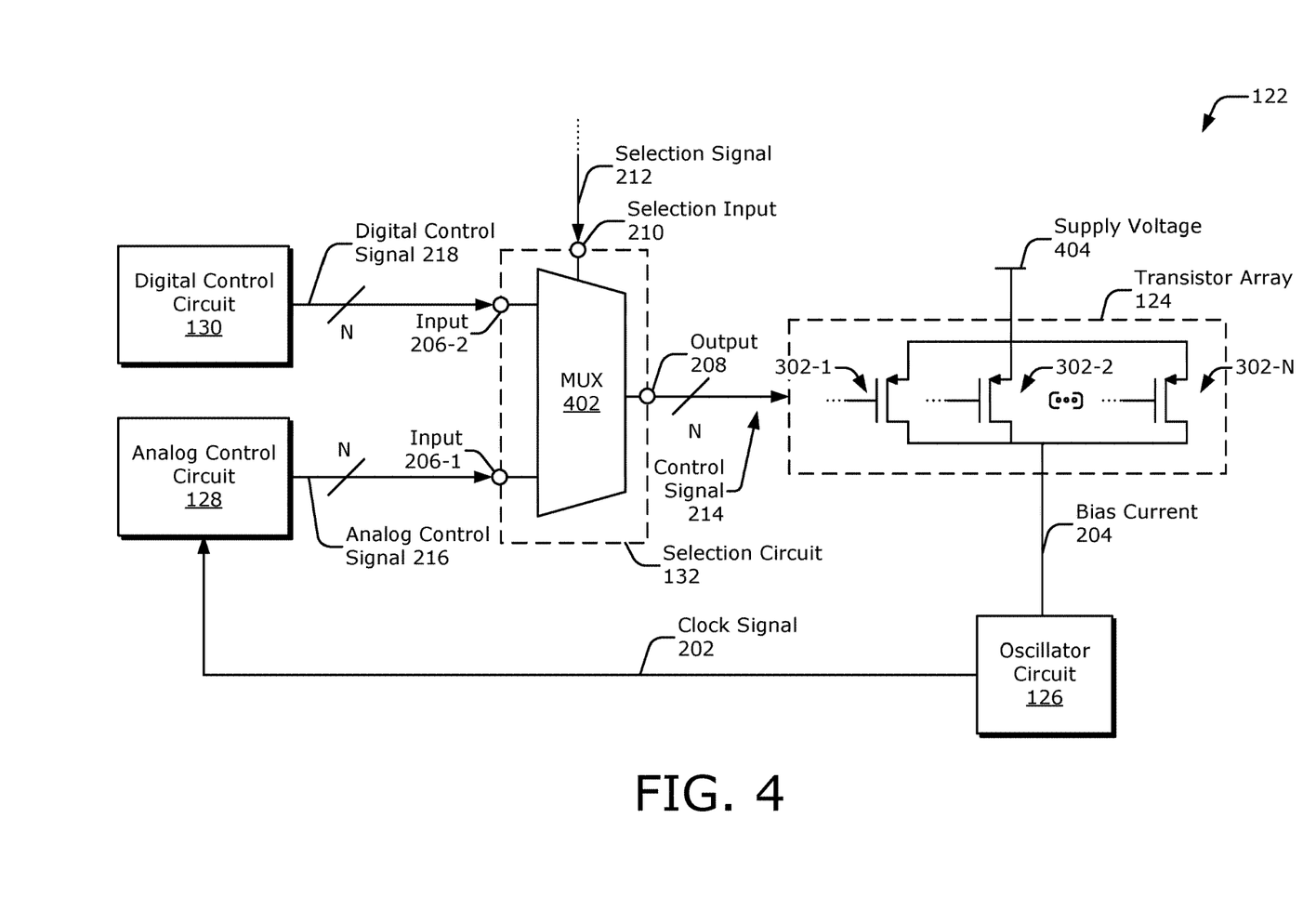
FIG. 4 illustrates a set of transistors in an example transistor array that are controlled via an analog control circuit or a digital control circuit for hybrid-controlled clock generation.
Figure 5:
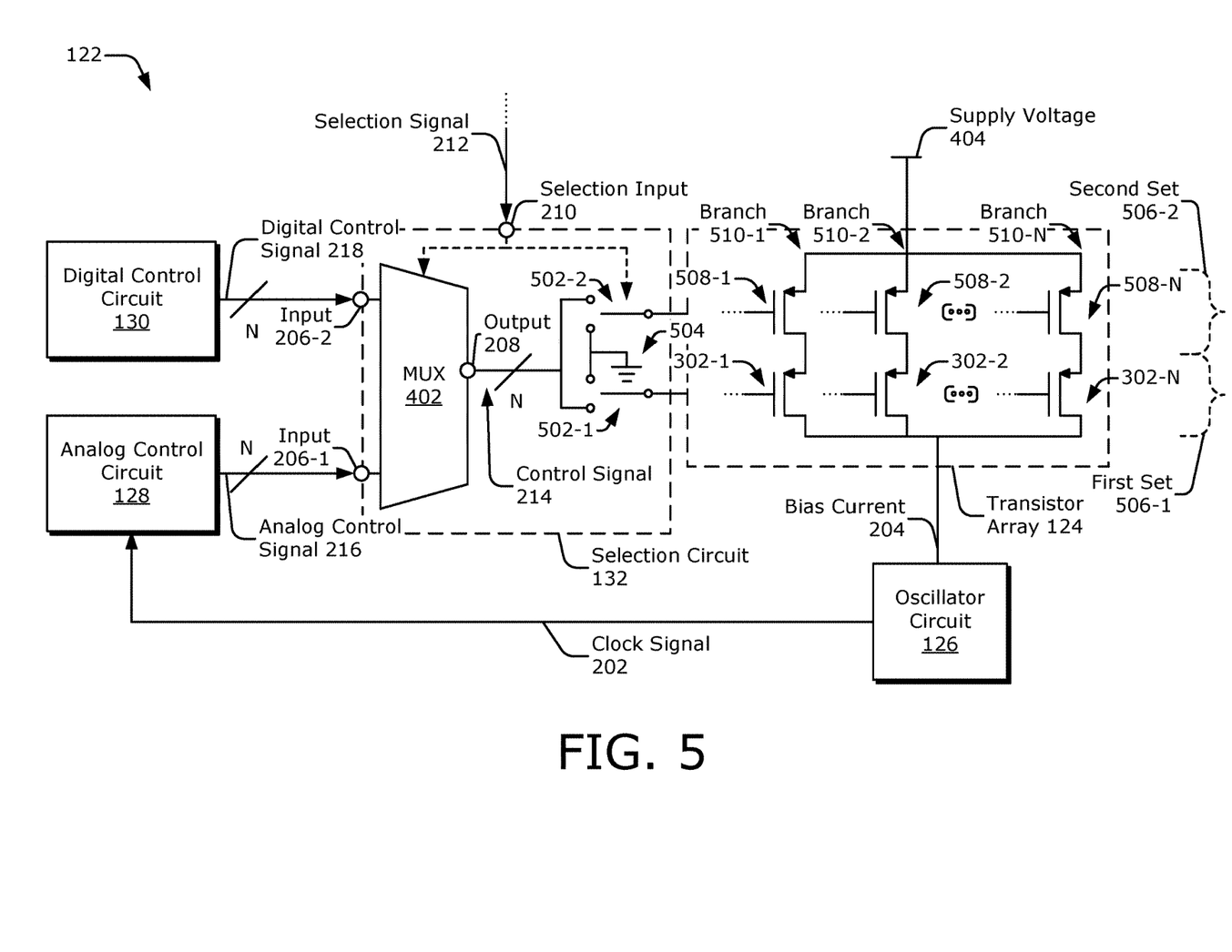
FIG. 5 illustrates different sets of transistors in an example transistor array that are controlled via an analog control circuit or a digital control circuit for hybrid-controlled clock generation.

The transistor array 124 is coupled to the oscillator circuit 126 and generates a bias current 204. The bias current 204 causes the oscillator circuit 126 to oscillate and generate the clock signal 202. The transistor array 124 includes at least two transistors, which can be implemented using any type of transistors, such as p-channel metal-oxide-semiconductor field-effect transistors (PMOSFETs). The transistors in the transistor array 124 can be arranged in series, parallel, or a combination thereof. Example arrangements of the transistors in the transistor array 124 are shown in FIGS. 4 and 5.

The selection circuit 132 includes a first input 206-1 coupled to the analog control circuit 128, a second input 206-2 coupled to the digital control circuit 130, and an output 208 coupled to the transistor array 124. The selection circuit 132 also includes a selection input 210, which is coupled to the modem 134 (of FIG. 1). The selection circuit 132 can be implemented using at least one multiplexer or at least one switch. The selection circuit 132 obtains a selection signal 212 via the selection input 210. Based on the selection signal 212, the selection circuit 132 connects the first input 206-1 or the second input 206-2 to the output 208. Via the output 208, the selection circuit 132 provides at least one control signal 214 that biases at least a portion of the transistors in the transistor array 124. Example implementations of the selection circuit 132 are shown in FIGS. 4 and 5.

The analog control circuit 128 generates at least one analog control signal 216, which is provided to the first input 206-1 of the selection circuit 132. Likewise, the digital control circuit 130 generates at least one digital control signal 218, which is provided to the second input 206-2 of the selection circuit 132. Based on the selection signal 212, the control signal 214 is provided at the output 208 via the analog control signal 216 or the digital control signal 218. In this way, the analog control circuit 128 or the digital control circuit 130 can control the clock signal 202 (e.g., the clock signal 202 is controlled by the bias current 204, which in turn is controlled by the control signal 214). The analog control signal 216 and the digital control signal 218 are further explained with respect to FIG. 3.

The analog control circuit 128 can include one or more active devices, such as transistors, diodes, or operational transconductance amplifiers (OTAs). The analog control circuit 128 may also include other components, such as capacitors. The analog control circuit 128 can be coupled to the oscillator circuit 126 and may also include an automatic gain control circuit 220. In this way, the analog control circuit 128 can monitor an amplitude of the clock signal 202 and adjust the bias current 204 accordingly via the analog control signal 216 and the control signal 214. By providing closed-loop control of the clock signal 202, the analog control circuit 128 can enable the oscillator circuit 126 to achieve stable oscillation at a target power consumption level.

The digital control circuit 130 can include one or more discrete voltage sources. The digital control circuit 130 can obtain a digital control adjustment signal 224, which specifies a voltage level of the discrete voltage source. As an example, the digital control circuit 130 can include one or more flip-flops or latches, which implement a register 222 that stores at least one bit. The digital control circuit 130 may be coupled to the modem 134. In this case, the modem 134 may write the digital control adjustment signal 224 to the register 222.

In addition to specifying the discrete voltage (e.g., whether a bit in the register 222 represents a one or a zero), the digital control adjustment signal 224 can assign different discrete voltages to different transistors in the transistor array 124. As an example, each bit in the register 222 may correspond to a transistor in the transistor array 124. Via the discrete voltages, the digital control circuit 130 can control an operational state of individual ones of the transistors in the transistor array 124 to enable different numbers of transistors to provide the bias current 204. By controlling the number of transistors that are enabled, the digital control circuit 130 can set the bias current 204 to a target value. In this way, the digital control circuit 130 provides open-loop control of the clock signal 202. The discrete voltages provided by the digital control circuit 130 also enable the clock signal 202 to achieve a target phase-noise performance. In some cases, the digital control circuit 130 enables the phase noise of the clock signal 202 to be approximately two to three decibels lower than using analog techniques.

To decrease a size of the clock generator 122 compared to other techniques, the analog control circuit 128 can be implemented using smaller active components, such as using smaller diodes, transistors, operational transconductance amplifiers, current mirrors, and so forth. Although the relatively smaller components can cause the analog control circuit 128 to be relatively noisier, the digital control circuit 130 can be employed to realize challenging, lower phase-noise thresholds that the analog control circuit 128 cannot achieve. As a result, the overall size of the clock generator 122 can shrink by a factor of approximately ten or more. In some cases, the analog control circuit 128 and the digital control circuit 130 can have a combined area that is smaller than the oscillator circuit 126. The control signal 214 that results from the analog control signal 216 or the digital control signal 218 comprises one or more control voltages, which are further described with respect to FIG. 3.

Figure 3:
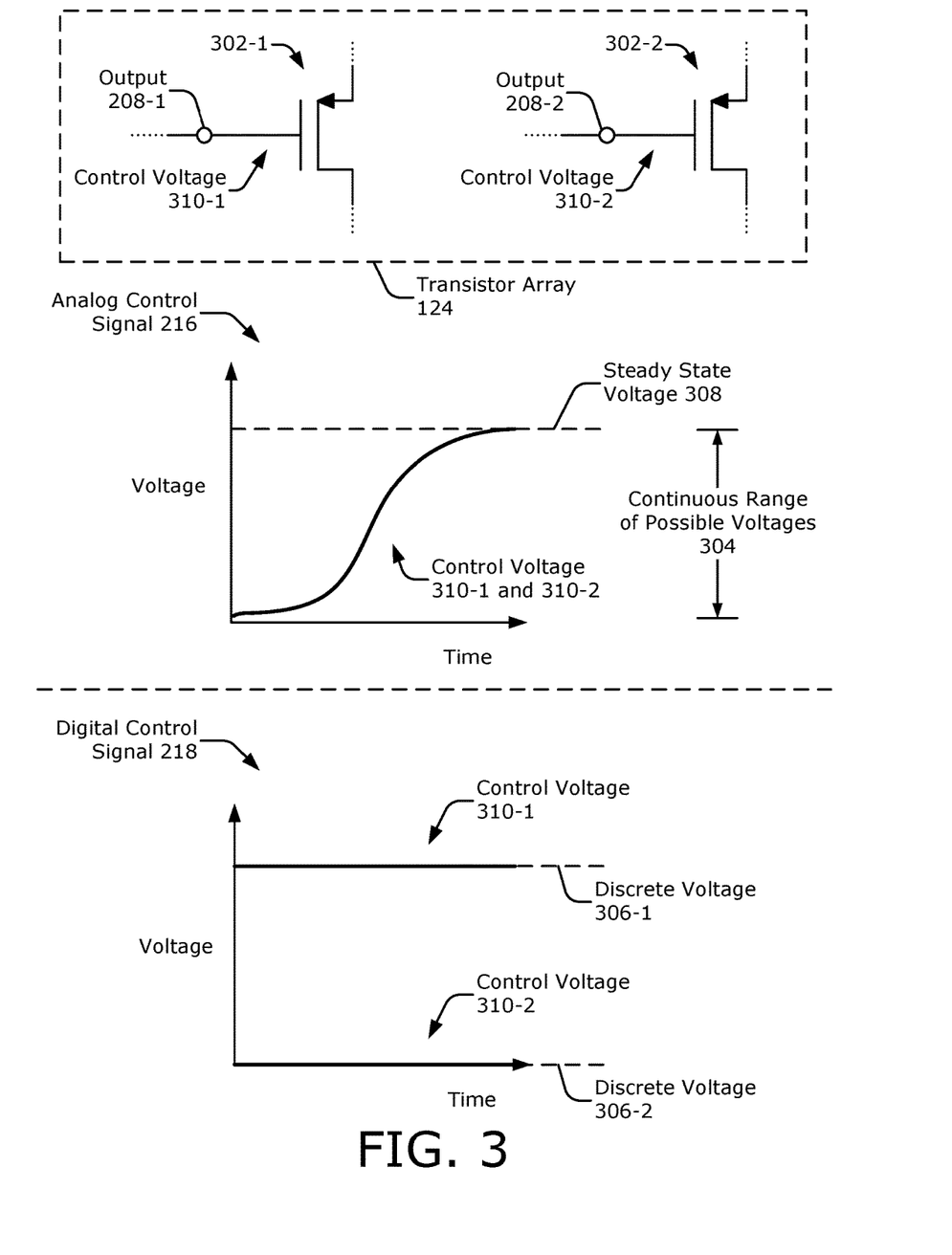
FIG. 3 illustrates example control voltages for hybrid-controlled clock generation.

FIG. 3 illustrates example control voltages 310 for hybrid-controlled clock generation. The control voltages 310 are representative of the control signal 214 of FIG. 2. In the depicted configuration, the transistor array 124 includes a first transistor 302-1 and a second transistor 302-2, which are shown having respective gates coupled to a first output 208-1 of selection circuit 132 and a second output 208-2 of selection circuit 132. At a gate of the first transistor 302-1, a first control voltage 310-1 is provided. Likewise, a second control voltage 310-2 is provided at a gate of the second transistor 302-2. The first transistor 302-1 and the second transistor 302-2 are shown to be implemented with PMOS-FETS. Alternatively or additionally, other types of transistors can be used. Although two transistors 302 are explicitly shown in FIG. 3, the transistor array 124 may have any number of transistors.

As shown in FIG. 3, the analog control signal 216 and the digital control signal 218 differ from each other in that the analog control signal 216 is an analog signal and the digital control signal 218 is a digital signal. In other words, the analog control signal 216 has a continuous range of possible voltages 304 as shown in an upper graph of FIG. 3. In contrast, the digital control signal 218 has a discrete set of possible voltages (e.g., a high voltage represented by a discrete voltage 306-1 or a low voltage represented by a discrete voltage 306-2) as shown in a lower graph of FIG. 3. The analog control signal 216 can cause the transistors 302 to operate as current sources by biasing the transistors 302 to operate in a saturation region. In contrast, the digital control signal 218 can cause the transistors 302 to operate as switches or variable resistors by biasing the transistors 302 to operate in a triode region (e.g., a linear region).

In some implementations, the analog control circuit 128 may generate a single analog control signal 216, which is provided to both the first output 208-1 and the second output 208-2. If there is a single node at the output 208 (e.g., the first output 208-1 and the second output 208-2 are coupled together), the gates of the first transistor 302-1 and the second transistor 302-2 may also be coupled together such that both transistors 302 obtain the analog control signal 216. Accordingly, the first control voltage 310-1 and the second control voltage 310-2 are shown to be similar in the upper graph of FIG. 3. In this way, the analog control circuit 128 can uniformly increase or decrease a current through each of the transistors 302. If the oscillator circuit 126 is unstable, such as during a start-up period, the analog control circuit 128 can decrease the control voltages 310-1 and 310-2 to increase the bias current 204. At the expense of increasing power consumption, increasing the bias current 204 causes an oscillation margin of the oscillator circuit 126 to increase, which ensures the oscillator circuit 126 can achieve steady-state operation. As the oscillator circuit 126 becomes stable and reaches the steady-state operation, the analog control circuit 128 can increase the control voltages 310-1 and 310-2 to a steady state voltage 308. This causes the bias current 204 to decrease, which enables the clock generator 122 to conserve power. Although the oscillation margin is also decreased, the analog control circuit 128 monitors the clock signal 202 to make adjustments that ensure the oscillator circuit 126 maintains a robust oscillation at an efficient power level.

In contrast, the digital control circuit 130 generates multiple digital control signals 218, which are respectively applied to each of the outputs 208-1 and 208-2 via the selection circuit 132. In this way, the digital control circuit 130 can individually enable or disable the transistors 302 to set the bias current 204. As shown, the first control voltage 310-1 may be set to the first discrete voltage 306-1 (as shown in the lower graph of FIG. 3), which causes the first transistor 302-1 to be disabled (e.g., turned-off such that a minimum amount of current flows through the first transistor 302-1). In contrast, the second control voltage 310-2 may be set to the second discrete voltage 306-2, which causes the second transistor 302-2 to be enabled (e.g., turned-on such that current flows through the second transistor 302-2). In some implementations, N digital control signals 218 may respectively represent N-bits that are stored in the register 222, where "N" represents a positive integer.

Other implementations are also possible. For example, the analog control circuit 128 may generate N analog control signals 216 that individually bias each of the multiple transistors 302. In this way, the analog control circuit 128 may enable any number of transistors 302 in the transistor array 124. As another example, the digital control circuit 130 may generate a single digital control signal 218 that causes all of the transistors 302 to be enabled. Accordingly, different degrees of freedom or different levels of control in adjusting the bias current 204 can be realized for various clock generators 122. The analog control circuit 128 and the digital control circuit 130 may control similar or different transistors 302 in the transistor array 124, as further described with respect to FIGS. 4 and 5.

FIG. 4 illustrates a set of transistors in the transistor array 124 that are controlled via the analog control circuit 128 or the digital control circuit 130 for hybrid-controlled clock generation. In the depicted configuration, the selection circuit 132 is implemented via a multiplexer (MUX) 402. The multiplexer 402 is shown as an N-bit multiplexer, having N input nodes at a first input 206-1, N input nodes at a second input 206-2, and N output nodes at the output 208. The transistor array 124 includes multiple transistors 302, such as transistors 302-1, 302-2 . . . 302-N. The multiple transistors 302 are coupled together in parallel between a supply voltage 404 and the oscillator circuit 126.

As shown in FIG. 4, a quantity of transistors 302 in the transistor array 124 equals a quantity of output nodes at the output 208 of the multiplexer 402. Accordingly, each output node is respectively coupled to a gate of the corresponding transistor 302. Based on the selection signal 212, the multiplexer 402 can respectively connect the input nodes at the first input 206-1 or the second input 206-2 to the gates of the multiple transistors 302. As mentioned with respect to FIG. 3, one or more analog control signals 216 or digital control signals 218 can be generated to bias the multiple transistors 302. Accordingly, the control signal 214 can include one or more control voltages 310 (e.g., up to "N" different control voltages 310).

FIG. 5 illustrates different sets of transistors in the transistor array 124 that are controlled via the analog control circuit 128 or the digital control circuit 130 for hybrid-controlled clock generation. In the depicted configuration, the selection circuit 132 includes the multiplexer 402, a first switch 502-1, a second switch 502-2, and a reference voltage 504. The transistor array 124 includes a first set of transistors 506-1 (first set 506-1), which includes the transistors 302-1, 302-2 . . . 302-N, and a second set of transistor 506-2 (second set 506-2), which includes transistors 508-1, 508-2 . . . 508-N. In this implementation, the first set of transistors 506-1 and the second set of transistors 506-2 are respectively coupled in series with each other and form branches 510-1, 510-2 . . . 510-N. The multiple branches 510 are coupled together in parallel with respect to each other between the supply voltage 404 and the oscillator circuit 126.

In this implementation, the selection signal 212 controls the selection of the multiplexer 402, a state of the first switch 502-1, and a state of the second switch 502-2. As shown, a total quantity of transistors in the transistor array 124 is twice a quantity of output nodes at the output 208 of the multiplexer 402 (e.g., twice a quantity of bits the multiplexer 402 supports). Accordingly, each of the output nodes is respectively coupled to the gates of the first set of transistors 506-1 or the second set of transistors 506-2 via the first switch 502-1 or the second switch 502-2.

If the analog control circuit 128 is selected by the selection signal 212, the first input 206-1 is connected to the output 208 via the multiplexer 402, and the respective gates of the first set of transistors 506-1 are connected to the output 208 via the first switch 502-1. Because the digital control circuit 130 is not selected, the selection signal 212 also causes the second switch 502-2 to connect respective gates of the second set of transistors 506-2 to the reference voltage 504. The reference voltage 504 is illustrated as a ground voltage, however other reference voltages may be used based on the type of transistors in the transistor array 124. By connecting the reference voltage 504, the selection circuit 132 causes the second set of transistors 506-2 to be enabled such that control of the bias current 204 is provided to the analog control circuit 128 via the first set of transistors 506-1.

On the other hand, if the digital control circuit 130 is selected, the second input 206-2 is connected to the output 208 via the multiplexer 402, and the respective gates of the second set of transistors 506-2 are connected to the output 208 via the second switch 502-2. Because the analog control circuit 128 is not selected, the selection signal 212 also causes the first switch 502-1 to couple respective gates of the first set of transistors 506-1 to the reference voltage 504. In this way, the selection circuit 132 causes the first set of transistors 506-1 to be enabled such that control of the bias current 204 is provided to the digital control circuit 130 via the second set of transistors 506-2.

Figure 6:
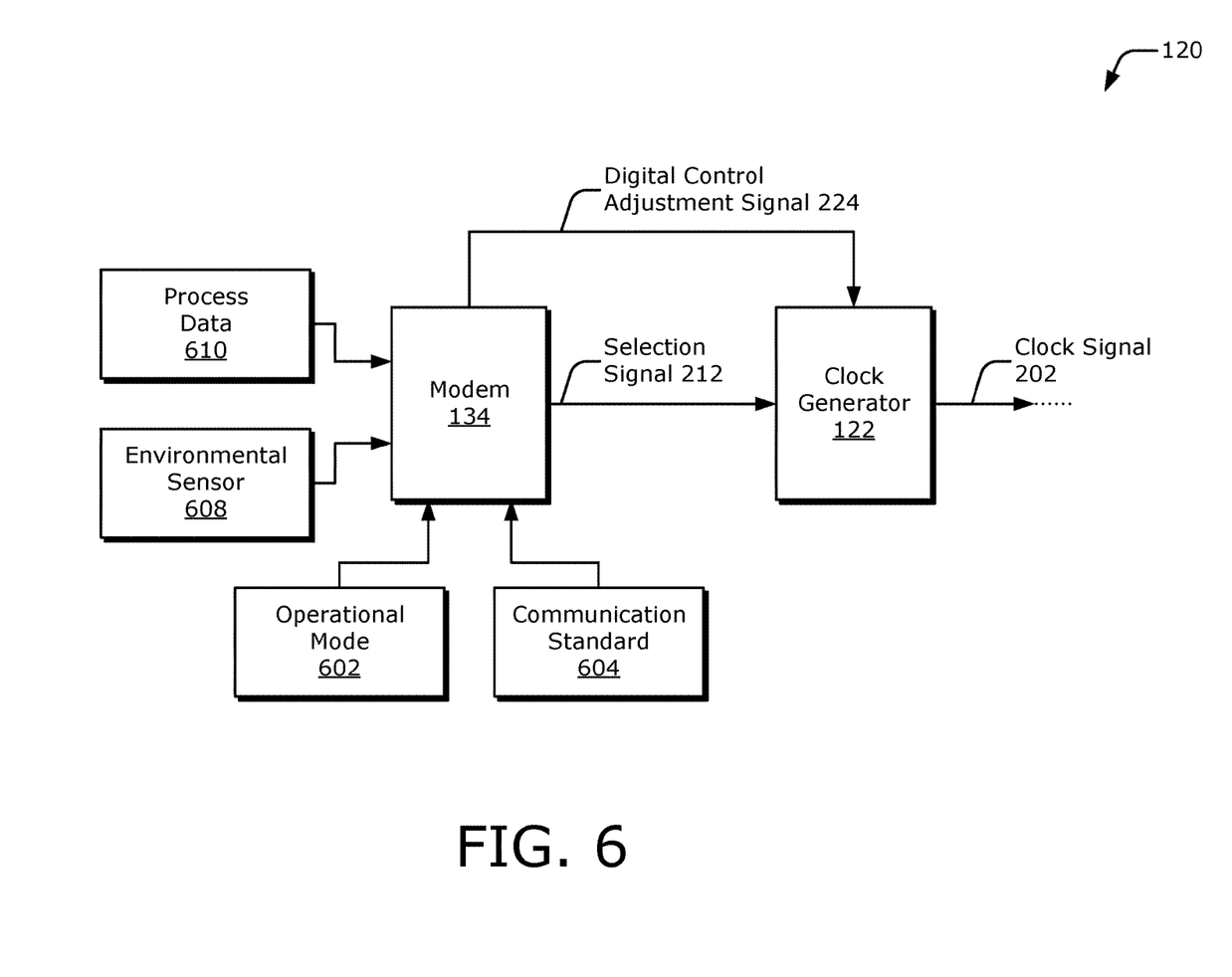
FIG. 6 illustrates an example implementation of a wireless transceiver for hybrid-controlled clock generation.

FIG. 6 illustrates an example implementation of the wireless transceiver 120 for hybrid-controlled clock generation. In the depicted configuration, the modem 134 is coupled to the clock generator 122. The clock generator 122 is coupled to other components (not shown) of the wireless transceiver 120, such as a phase-locked loop, a delay-locked loop, a mixer, a signal generator, and so forth. The modem 134 generates the selection signal 212, which causes the clock generator 122 to employ the analog control circuit 128 or the digital control circuit 130 for controlling the clock generation. Using the selected circuit, the clock generator 122 generates the clock signal 202, which is used as a stable frequency reference by the wireless transceiver 120.

The modem 134 can determine whether to select the analog control circuit 128 or the digital control circuit 130 based on a noise state of the wireless transceiver 120. If the wireless transceiver 120 is operating in a high-noise state in which noise performance of the clock generator 122 is not critical or the target phase noise can be realized with the analog control circuit 128, the modem 134 can select the analog control circuit 128. This can further enable the clock generator 122 to achieve a target power consumption level while maintaining oscillation. In contrast, if the wireless transceiver 120 is operating in a low-noise state in which the noise performance of the clock generator 122 affects communication performance of the wireless transceiver 120 or the target phase noise cannot be realized with the analog control circuit 128, the modem 134 can select the digital control circuit 130. In other words, the digital control circuit 130 can be selected if (a) biasing the transistor array 124 via the analog control signal 216 causes the phase noise of the clock signal 202 to be greater than a phase-noise threshold and (b) biasing the transistor array 124 via the digital control signal 218 causes the phase noise to be less than or equal to the phase-noise threshold. By utilizing the digital control circuit 130, the target phase noise can be realized and the wireless transceiver 120 can detect weaker signals or signals originating from farther distances.

The noise state of the wireless transceiver 120 can be determined by the modem 134 based on an operational mode 602 or a communication standard 604. Example operational modes 602 include an active mode, a start-up mode, a standby (e.g., sleep) mode, and an airplane mode. In the active mode, the wireless transceiver 120 may transmit or receive communication signals for an active call, establish the wireless link 106, scan for or join nearby Wi-Fi networks, update global positioning system coordinates, and so forth. Before the active mode occurs, a start-up mode can be used to enable the oscillator circuit 126 to reach a steady state. If the wireless transceiver 120 is not in the active mode, the modem 134 may set the wireless transceiver 120 in the standby mode to conserve power. This may occur between active data cycles or for a predetermined time frame set by the modem 134. In the airplane mode, a user may temporarily disable the active mode or suspend communications made in accordance with one or more communication standards 604 supported by the wireless transceiver 120. The target phase-noise performance across these different operational modes 602 can vary significantly. For example, the standby mode may have a phase-noise threshold that is between approximately ten to twenty decibels higher than another phase-noise threshold of the active mode. Accordingly, the active mode may correspond to a low-noise state and the start-up mode, the standby mode, or airplane mode may correspond to a high-noise state.

The noise state of the active mode can be further characterized based on the communication standard 604. For example, a 5G cellular standard may correspond to the high-noise state and a 2G cellular standard may correspond to the low-noise state. The operational mode 602 and the communication standard 604 can be set by the modem 134 or obtained by the modem 134 from the processor 108 or the computer-readable storage medium 110. In some cases, the modem 134 can reference a look-up table (LUT), which specifies conditions for selecting the analog control circuit 128 or the digital control circuit 130 based on the operational mode 602 or the communication standard 604.

The modem 134 also generates the digital control adjustment signal 224, which can adjust the digital control signal 218 based on additional information obtained by the modem 134. These adjustments may be based on temperature changes, variations in the supply voltage 404, predetermined process data, and so forth. For example, the modem 134 can be coupled to an environmental sensor 608. The environmental sensor 608 can include a temperature sensor that senses a temperature of a die associated with the clock generator 122 or a temperature of the quartz crystal 226 implemented in the oscillator circuit 126. Alternatively or additionally, the environmental sensor 608 can include a voltage sensor that senses the supply voltage 404 in FIG. 4 or 5. As another example, the modem 134 may obtain process data 610, which characterizes components within the clock generator 122 that may vary across multiple clock generators 122 due to manufacturing variations. The process data 610 can include, for example, threshold voltages of the transistors 302 or 508 within the transistor array 124, drive strength of the oscillator circuit 126, and so forth. Based on this information, the digital control adjustment signal 224 can adjust levels of the discrete voltages 306 provided by the digital control circuit 130 or adjust which transistors in the transistor array 124 are enabled or disabled. In some cases, this information can also be used for determining the noise state, and thus the selection of the analog control circuit 128 or the digital control circuit 130.

The digital control adjustment signal 224 can also be based on the operational mode 602 or the communication standard 604. To achieve a target phase-noise performance or a target power consumption level associated with the operational mode 602 or the communication standard 604, the modem 134 may, for example, adjust the levels of the discrete voltages 306 or adjust which transistors in the transistor array 124 are enabled or disabled via the digital control adjustment signal 224. In some cases, the modem 134 may balance phase-noise performance with power consumption such that the digital control adjustment signal 224 enables the clock generator 122 to achieve the phase-noise threshold at a lowest power consumption level.

Figure 7:
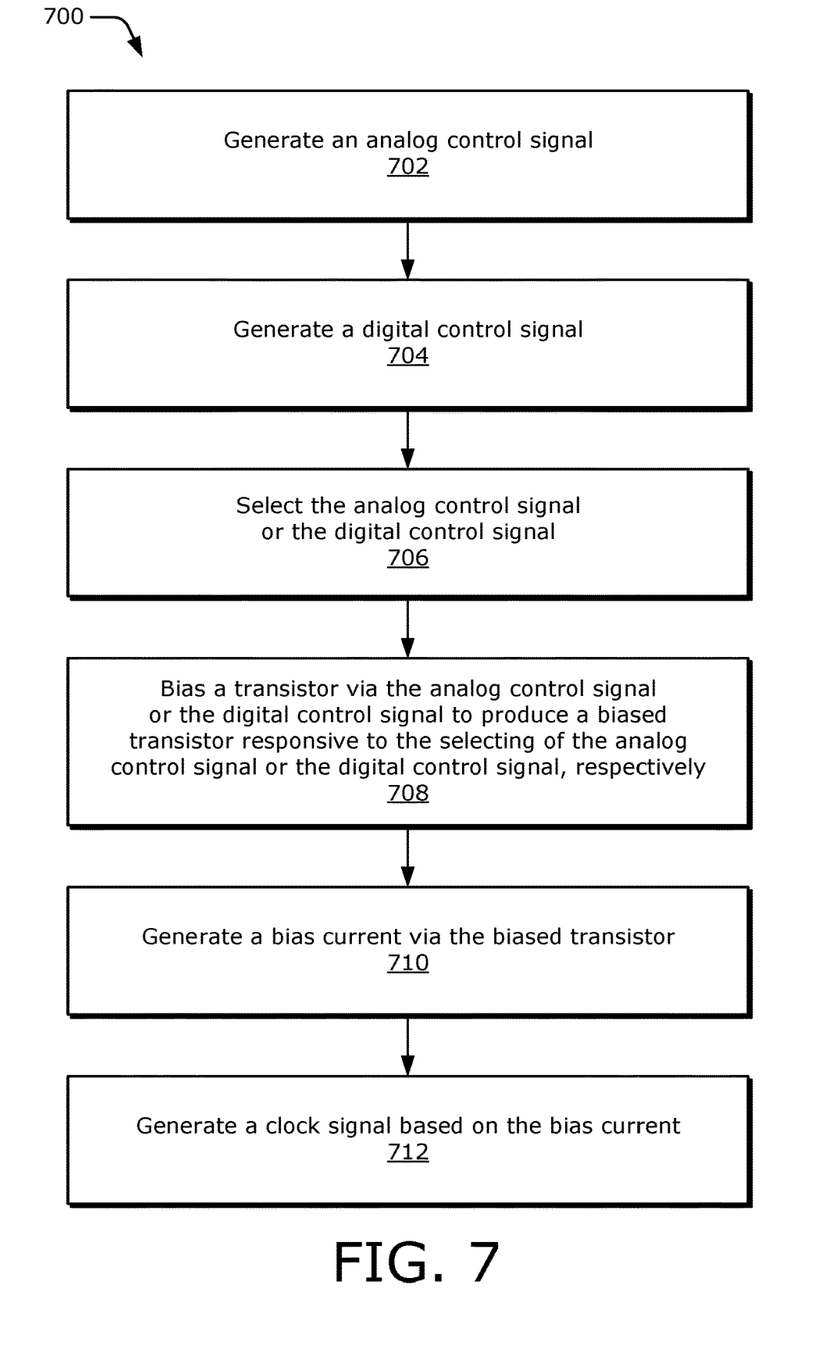
FIG. 7 is a flow diagram illustrating an example process for hybrid-controlled clock generation.

FIG. 7 is a flow diagram illustrating an example process 700 for hybrid-controlled clock generation. The process 700 is described in the form of a set of blocks 702-712 that specify operations that can be performed. However, operations are not necessarily limited to the order shown in FIG. 7 or described herein, for the operations may be implemented in alternative orders or in fully or partially overlapping manners. Operations represented by the illustrated blocks of the process 700 may be performed by a clock generator 122 (e.g., of FIG. 1, 2 or 6) or a modem 134 (e.g., of FIG. 1 or 6). More specifically, the operations of the process 700 may be performed by an analog control circuit 128, a digital control circuit 130, or a selection circuit 132, as shown in FIG. 2, 4 or 5.

At block 702, an analog control signal is generated. For example, the analog control circuit 128 or the automatic gain control circuit 220 can generate one or more analog control signals 216. The analog control signal 216 comprises an analog signal that can have any voltage within the continuous range of possible voltages 304, as shown in FIG. 3.

At block 704, a digital control signal is generated. For example, the digital control circuit 130 or the register 222 can generate one or more digital control signals 218. The digital control signal 218 comprises a digital signal that can have any voltage within a set of discrete voltages 306, as shown in FIG. 3.

At block 706, the analog control signal or the digital control signal is selected. For example, the selection circuit 132 can select the analog control signal 216 or the digital control signal 218 based on a selection signal 212, as shown in FIGS. 4 and 5. The selection signal 212 can be provided by a processor, such as the modem 134 of FIG. 1 or 6. The selection may be based on a noise state of the wireless transceiver 120, which may be determined by the modem 134 according to the operational mode 602, the communication standard 604, environmental data obtained from the environmental sensor 608, or process data 610 stored in the computer-readable storage medium 110.

At block 708, a transistor is biased via the analog control signal or the digital control signal to produce a biased transistor responsive to the selecting of the analog control signal or the digital control signal, respectively. For example, the selection circuit 132 can provide the analog control signal 216 or the digital control signal 218 to at least one transistor 302 or 508 of the transistor array 124 by connecting the transistor array 124 to the analog control circuit 128 or the digital control circuit 130 via the multiplexer 402, the first switch 502-1, or the second switch 502-2, as shown in FIGS. 4, and 5. The selected signal can be provided, for example, to gates of the transistors 302 or 508 within the transistor array 124. In some implementations, the analog control signal 216 and the digital control signal 218 may be provided to a set of transistors or to different sets of transistors, as shown in FIGS. 4 and 5.

At block 710, a bias current is generated via the biased transistor. For example, at least one biased transistor of the transistor array 124 can generate the bias current 204. The biased transistor may include one or more of the transistors 302 in FIG. 4, one or more of the transistors 302 in the first set of transistors 506-1 in FIG. 5, or one or more of the transistors 508 in the second set of transistors 506-2 in FIG. 5. In some implementations, portions of the bias current 204 can be generated through one or more parallel branches in the transistor array 124, such as those formed via the multiple transistors 302-1, 302-2, . . . 302-N as shown in FIG. 4 or via the multiple branches 510-1, 510-2, . . . 510-N as shown in FIG. 5.

At block 712, a clock signal is generated based on the bias current. For example, the oscillator circuit 126 can generate the clock signal 202 based on the bias current 204. In some implementations, the oscillator circuit 126 may include a single quartz crystal, such as the quartz crystal 226. Based on a voltage or a quantity of the transistors 302 or 508 that are enabled via the analog control signal 216 or the digital control signal 218, the analog control circuit 128 or the digital control circuit 130 can respectively control the bias current 204, which effectively controls the clock signal 202. The clock signal 202 can be provided as a stable frequency reference to other components in the wireless transceiver 120.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
an analog control circuit;
a digital control circuit;
an oscillator circuit;
a transistor array comprising multiple transistors coupled together in parallel between a supply voltage and the oscillator circuit; and
a selection circuit including a first input coupled to the analog control circuit, a second input coupled to the digital control circuit, and an output coupled to the transistor array, the selection circuit configured to:
  obtain a selection signal that is indicative of the first input coupled to the analog control circuit or the second input coupled to the digital control circuit; and
  connect, based on the selection signal, the analog control circuit or the digital control circuit to one or more gates of the multiple transistors of the transistor array.

2. The apparatus of claim 1, wherein:
the transistor array is configured to generate, based on a control voltage, a bias current using one or more of the multiple transistors;
the analog control circuit is configured to generate an analog control signal that provides the control voltage responsive to the analog control circuit being connected to the one or more gates of the multiple transistors via the selection circuit;
the digital control circuit is configured to generate a digital control signal that provides the control voltage responsive to the digital control circuit being connected to the one or more gates of the multiple transistors via the selection circuit; and
the oscillator circuit is configured to generate a clock signal based on the bias current.

3. The apparatus of claim 2, wherein:
the analog control circuit comprises an automatic gain control circuit coupled to the oscillator circuit, the automatic gain control circuit configured to:
  monitor an amplitude of the clock signal; and
  adjust the bias current via the analog control signal based on the amplitude of the clock signal; and
the digital control circuit comprises a register, the register configured to:
  obtain a digital control adjustment signal from a processor; and
  adjust the bias current via the digital control signal based on the digital control adjustment signal.

4. The apparatus of claim 2, wherein:
the analog control signal comprises multiple analog control signals;
the analog control circuit is configured to use the multiple analog control signals to respectively set control voltages at two or more gates of the multiple transistors responsive to being connected to the two or more gates of the multiple transistors via the selection circuit;

the digital control signal comprises multiple digital control signals; and the digital control circuit is configured to use the multiple digital control signals to respectively set the control voltages at the two or more gates of the multiple transistors responsive to being connected to the two or more gates of the multiple transistors via the selection circuit.

5. The apparatus of claim 4, wherein:

a quantity of the multiple analog control signals and a quantity of the multiple digital control signals are both equal to a quantity of the multiple transistors; and the selection circuit comprises a multiplexer, the multiplexer includes a selection input, the multiplexer configured to:

obtain the selection signal from a processor via the selection input;

obtain the multiple analog control signals via the first input;

obtain the multiple digital control signals via the second input; and respectively provide, via the output, the multiple analog control signals or the multiple digital control signals to the two or more gates of the multiple transistors based on the selection signal.

6. The apparatus of claim 2, wherein:

the multiple transistors include a first set of transistors respectively coupled in series with a second set of transistors to form multiple branches, the multiple branches coupled in parallel with each other;

the analog control signal comprises a single analog control signal that provides a first control voltage as the control voltage;

the digital control signal comprises multiple digital control signals that respectively provide second control voltages as the control voltage; and the selection circuit is configured to selectively:

provide the first control voltage to one or more gates of the first set of transistors via the single analog control signal; or provide the second control voltages respectively to two or more gates of the second set of transistors via the multiple digital control signals.

7. The apparatus of claim 6, wherein the selection circuit is configured to:

based on the analog control circuit being connected to the one or more gates of the first set of transistors, connect one or more gates of the second set of transistors to a reference voltage; or based on the digital control circuit being connected to the two or more gates of the second set of transistors, connect the two or more gates of the first set of transistors to the reference voltage.

8. The apparatus of claim 2, wherein:

at least a portion of the multiple transistors are configured to operate in a saturation region based on the analog control signal; and at least another portion of the multiple transistors are configured to operate in a linear region based on the digital control signal.

9. The apparatus of claim 1, wherein the multiple transistors comprise multiple p-channel metal-oxide-semiconductor field-effect transistors having respective sources coupled to the supply voltage and respective drains coupled to the oscillator circuit.

10. The apparatus of claim 1, wherein the oscillator circuit includes a single quartz crystal.

11. The apparatus of claim 1, further comprising a clock generator, the clock generator including the analog control circuit, the digital control circuit, the transistor array, the oscillator circuit, and the selection circuit.

12. An apparatus comprising:

an analog control circuit;

a digital control circuit;

an oscillator circuit configured to generate a clock signal based on a bias current;

a transistor array configured to generate the bias current based on a control voltage, the transistor array comprising multiple transistors coupled together in parallel between a supply voltage and the oscillator circuit; and selection means for providing the control voltage to bias the transistor array; the selection means coupled to the analog control circuit, the digital control circuit, and the transistor array; the selection means configured to connect the analog control circuit or the digital control circuit to one or more gates of the multiple transistors of the transistor array based on a selection signal.

13. The apparatus of claim 12, wherein:

the analog control circuit is configured to generate an analog control signal that provides the control voltage responsive to the analog control circuit being connected to the one or more gates of the multiple transistors via the selection means; and the digital control circuit is configured to generate a digital control signal that provides the control voltage responsive to the digital control circuit being connected to the one or more gates of the multiple transistors via the selection means.

14. The apparatus of claim 12, wherein:

the selection means includes a selection input; and the selection means is configured to obtain the selection signal from a processor via the selection input.

15. The apparatus of claim 12, wherein:

the selection means is configured to:

connect the analog control circuit to a portion of the gates of the multiple transistors; or connect the digital control circuit to another portion of the gates of the multiple transistors.

16. The apparatus of claim 15, wherein the selection means comprises switch means for providing a reference voltage that biases the transistor array, the switch means configured to:

based on the analog control circuit being connected to the portion of the gates of the multiple transistors, connect the other portion of the gates of the multiple transistors to the reference voltage; or based on the digital control circuit being connected to the other portion of the gates of the multiple transistors, connect the portion of the gates of the multiple transistors to the reference voltage.

17. A method for hybrid-controlled clock generation, the method comprising:

generating an analog control signal;

generating a digital control signal;

selecting the analog control signal or the digital control signal;

biasing a transistor array via the analog control signal or the digital control signal, the transistor array comprising multiple transistors coupled together in parallel between a supply voltage and an oscillator circuit;

generating a bias current via one or more of the multiple transistors; and generating, based on the bias current, a clock signal via the oscillator circuit.

18. The method of claim 17, further comprising:
monitoring an amplitude of the clock signal; and
setting a voltage of the analog control signal based on the amplitude of the clock signal to achieve a predetermined power consumption level.

19. The method of claim 17, further comprising:
monitoring a temperature associated with the generating of the clock signal; and
generating the digital control signal based on the temperature.

20. The method of claim 17, further comprising setting a voltage of the digital control signal based on a threshold voltage associated with the multiple transistors.

21. An apparatus comprising:
an oscillator circuit;
a transistor array comprising multiple transistors coupled together in parallel between a supply voltage and the oscillator circuit;
an automatic gain control circuit coupled to the oscillator circuit;
a processor;
a register coupled to the processor; and
a multiplexer including a first input coupled to the automatic gain control circuit, a second input coupled to the register, an output coupled to one or more gates of the multiple transistors of the transistor array, and a selection input coupled to the processor.

22. The apparatus of claim 21, wherein:
the transistor array is configured to generate, based on a control voltage, a bias current using one or more of the multiple transistors;
the oscillator circuit is configured to generate a clock signal based on the bias current;
the automatic gain control circuit is configured to:
monitor an amplitude of the clock signal; and
generate, based on the amplitude of the clock signal, an analog control signal that provides the control voltage;
the processor is configured to:
write a digital control adjustment signal to the register; and
generate a selection signal that selects the first input or the second input of the multiplexer;
the register is configured to generate, based on the digital control adjustment signal, a digital control signal that provides the control voltage; and
the multiplexer is configured to:
obtain the selection signal via the selection input; and
connect the automatic gain control circuit or the register to the one or more gates of the multiple transistors based on the selection signal.

23. The apparatus of claim 21, wherein:
the automatic gain control circuit is configured to generate a single analog control signal to provide a same control voltage to the one or more gates of the multiple transistors via the multiplexer.

24. The apparatus of claim 21, wherein:
the automatic gain control circuit is configured to generate multiple analog control signals that respectively provide multiple control voltages to two or more gates of the multiple transistors via the multiplexer.

25. The apparatus of claim 24, wherein:
the register is configured to store multiple bits, the multiple bits are respectively associated with the multiple transistors, and the multiple bits are respectively represented by multiple discrete voltages; and
the register is configured to respectively provide the multiple discrete voltages at the two or more gates of the multiple transistors via the multiplexer.

26. The apparatus of claim 21, wherein the oscillator circuit includes a single quartz crystal.

27. The apparatus of claim 13, wherein:
the analog control circuit comprises an automatic gain control circuit coupled to the oscillator circuit, the automatic gain control circuit configured to:
monitor an amplitude of the clock signal; and
adjust the bias current via the analog control signal based on the amplitude of the clock signal; and
the digital control circuit comprises a register, the register configured to:
obtain a digital control adjustment signal from a processor; and
adjust the bias current via the digital control signal based on the digital control adjustment signal.

28. The apparatus of claim 13, wherein:
the analog control signal comprises multiple analog control signals that respectively provide first control voltages;
the digital control signal comprises multiple digital control signals that respectively provide second control voltages; and
the selection means is configured to:
provide the first control voltages respectively at the one or more gates of the multiple transistors via the multiple analog control signals; or
provide the second control voltages respectively at the one or more gates of the multiple transistors via the multiple digital control signals.

29. The apparatus of claim 13, wherein:
the multiple transistors include a first set of transistors respectively coupled in series with a second set of transistors to form multiple branches, the multiple branches coupled in parallel with each other;
the analog control signal comprises a single analog control signal that provides a first control voltage as the control voltage;
the digital control signal comprises multiple digital control signals that respectively provide second control voltages as the control voltage; and
the selection means is configured to selectively:
provide the first control voltage at one or more gates of the first set of transistors via the single analog control signal; or
provide the second control voltages respectively at two or more gates of the second set of transistors via the multiple digital control signals.

30. The method of claim 17, wherein:
the biasing of the transistor array comprises:
biasing gates of at least a portion of the multiple transistors to cause the portion of the multiple transistors to operate in a saturation region based on the analog control signal; or
biasing other gates of at least another portion of the multiple transistors to cause the other portion of the multiple transistors to operate in a linear region based on the digital control signal.

* * * * *